United States Patent
Honishi et al.

(10) Patent No.: US 11,908,970 B2
(45) Date of Patent: Feb. 20, 2024

(54) PROCESS FOR MANUFACTURING MULTILAYERED THIN FILM, METHOD OF MANUFACTURING SOLAR CELL, AND METHOD FOR MANUFACTURING SOLAR CELL MODULE

(71) Applicants: KABUSHIKI KAISHA TOSHIBA, Tokyo (JP); TOSHIBA ENERGY SYSTEMS & SOLUTIONS CORPORATION, Kawasaki (JP)

(72) Inventors: Yuya Honishi, Saitama Saitama (JP); Soichiro Shibasaki, Nerima Toyko (JP); Naoyuki Nakagawa, Setagaya Tokyo (JP); Mutsuki Yamazaki, Yokohama Kanagawa (JP); Yoshiko Hiraoka, Kawasaki Kanagawa (JP); Kazushige Yamamoto, Yokohama Kanagawa (JP)

(73) Assignees: KABUSHIKI KAISHA TOSHIBA, Tokyo (JP); TOSHIBA ENERGY SYSTEMS & SOLUTIONS CORPORATION, Kawasaki (JP)

(*) Notice: Subject to any disclaimer, the term of this patent is extended or adjusted under 35 U.S.C. 154(b) by 416 days.

(21) Appl. No.: 17/460,375

(22) Filed: Aug. 30, 2021

(65) Prior Publication Data
US 2021/0391491 A1    Dec. 16, 2021

Related U.S. Application Data

(63) Continuation of application No. PCT/JP2020/032088, filed on Aug. 25, 2020.

(30) Foreign Application Priority Data

Mar. 23, 2020   (JP) ................ 2020-051555

(51) Int. Cl.
H01L 31/18    (2006.01)
H01L 31/043    (2014.01)
(Continued)

(52) U.S. Cl.
CPC ...... *H01L 31/18* (2013.01); *H01L 31/022466* (2013.01); *H01L 31/032* (2013.01);
(Continued)

(58) Field of Classification Search
None
See application file for complete search history.

(56) References Cited

U.S. PATENT DOCUMENTS

2012/0097227 A1* 4/2012 Lim ............ H01L 31/02168
                                                                136/255
2012/0152337 A1   6/2012 Aytug et al.
(Continued)

FOREIGN PATENT DOCUMENTS

| JP | 2017-054197 | 3/2017 |
| JP | 2021-009958 | 1/2021 |
| WO | 2019/058605 | 3/2019 |

OTHER PUBLICATIONS

Bugarinovic, Sanja, Mirjana Rajcic-Vujasinovic, Zoran Stevic, and Vesna Grekulovi. 2011. 'Cuprous Oxide as an Active Material for Solar Cells'. Solar Cells—New Aspects and Solutions. InTech. doi: 10.5772/21307. (Year: 2011).*

(Continued)

*Primary Examiner* — Erik T. K. Peterson
*Assistant Examiner* — Christopher A. Schodde
(74) *Attorney, Agent, or Firm* — Amin, Turocy & Watson, LLP

(57) ABSTRACT

A process for manufacturing a multilayered thin film, includes: forming a photovoltaic conversion layer, comprising $Cu_2O$ as a main component, on a first transparent electrode; and placing, under a first atmosphere at an oxygen level of from $5.0 \times 10^{-8}$ [g/L] to $5.0 \times 10^{-5}$ [g/L] for 1 h to 1600 h, a member having the photovoltaic conversion layer formed on the first transparent electrode.

10 Claims, 8 Drawing Sheets

(51) Int. Cl.

| | | |
|---|---|---|
| *H01L 31/0445* | (2014.01) | |
| *H01L 31/0224* | (2006.01) | |
| *H01L 31/032* | (2006.01) | |
| *H01L 31/074* | (2012.01) | |
| *H02S 10/40* | (2014.01) | |
| *H02S 40/38* | (2014.01) | |
| *H01L 31/072* | (2012.01) | |
| *H01L 31/0725* | (2012.01) | |

(52) U.S. Cl.
CPC ........ *H01L 31/043* (2014.12); *H01L 31/0445* (2014.12); *H01L 31/072* (2013.01); *H01L 31/074* (2013.01); *H01L 31/0725* (2013.01); *H02S 10/40* (2014.12); *H02S 40/38* (2014.12)

(56) References Cited

U.S. PATENT DOCUMENTS

| | | | |
|---|---|---|---|
| 2017/0025555 A1* | 1/2017 | Zhu | .................. H01B 1/08 |
| 2019/0198697 A1 | 6/2019 | Honishi et al. | |
| 2021/0184066 A1 | 6/2021 | Honishi et al. | |

OTHER PUBLICATIONS

International Search Report and Written Opinion for International Application No. PCT/JP2020/032088 dated Oct. 21, 2020, 15 pgs.

Lee, et al. "Improved Cu2O-Based Solar Cells Using Atomic Layer Deposition to Control the Cu Oxidation State at the b-n Junction", Adv. Energy Mater. 2014, 4, 1301916.

Zhang, et al. "Highly stable copper oxide compsite as an effective photocathode for water splitting via a facile electrochemical synthesis strategy", Journal of Materials Chemistry, 2012, 22, 2456-2464.

Wang, et al. "Redix Prioertuies of Cu2O(100) and (111) Surfaces" The Journal of Physical Chemistry C, 2018, vol. 122, pp. 28684-28691.

Poulston, et al. "Surface Oxidation and Reduction of CuO and Cu2O Studied Using XPS and XAES" Surface and International Analysis, 1996, vol. 24, pp. 811-820.

Valladares, et al. "Crystallization and electrical resistivity of Cu2O and CuO obtained by the thermal oxidation of Cu thin films on SiO2/Si Substrates" Thin Solid Films 520 (2012) 6368-6374.

Chua, et al. "Enhancement of the open circuit voltage of Cu2O/Ga2O3 heterojunction solar cells through the mitigation of interfacial recombination" AIP Advances 9, 055203 (2019).

* cited by examiner

| | LOW-OXYGEN ATMOSPHERE | | | | | | AIR | |
|---|---|---|---|---|---|---|---|---|
| | OXYGEN LEVEL | WATER VAPOR LEVEL | TOTAL PRESSURE | TEMPERATURE | RETENTION TIME | OXYGEN LEVEL × TIME | WATER VAPOR LEVEL × TIME | TEMPERATURE | RETENTION TIME |
| | g/L | g/L | Pa | °C | hrs | hrs × g × L | hrs × g × L | °C | hrs |
| EXAMPLE 1 | 1.5E-07 | 1.2E-06 | 1.0E+05 | 25 | 72 | 1.1E-05 | 8.6E-05 | 25 | 0.5 |
| EXAMPLE 2 | 1.5E-07 | 1.2E-06 | 1.0E+05 | 25 | 3 | 4.5E-07 | 3.6E-06 | 25 | 0.5 |
| EXAMPLE 3 | 1.5E-07 | 1.2E-06 | 1.0E+05 | 25 | 10 | 1.5E-06 | 1.2E-05 | 25 | 0.5 |
| EXAMPLE 4 | 1.5E-07 | 1.2E-06 | 1.0E+05 | 25 | 100 | 1.5E-05 | 1.2E-04 | 25 | 0.5 |
| EXAMPLE 5 | 1.5E-07 | 1.2E-06 | 1.0E+05 | 25 | 240 | 3.6E-05 | 2.9E-04 | 25 | 0.5 |
| EXAMPLE 6 | 1.5E-07 | 1.2E-06 | 1.0E+05 | 25 | 500 | 7.5E-05 | 6.0E-04 | 25 | 0.5 |
| EXAMPLE 7 | 1.5E-07 | 1.2E-06 | 1.0E+05 | 25 | 1000 | 1.5E-04 | 1.2E-03 | 25 | 0.5 |
| EXAMPLE 8 | 1.5E-07 | 1.2E-06 | 1.0E+05 | 25 | 1600 | 2.4E-04 | 1.9E-03 | 25 | 0.5 |
| EXAMPLE 9 | 5.0E-08 | 1.2E-06 | 1.0E+05 | 25 | 500 | 2.5E-05 | 6.0E-04 | 25 | 0.5 |
| EXAMPLE 10 | 2.0E-07 | 1.2E-06 | 1.0E+05 | 25 | 500 | 1.0E-04 | 6.0E-04 | 25 | 0.5 |
| EXAMPLE 11 | 1.0E-06 | 1.2E-06 | 1.0E+05 | 25 | 500 | 5.0E-04 | 6.0E-04 | 25 | 0.5 |
| EXAMPLE 12 | 1.0E-05 | 1.2E-06 | 1.0E+05 | 25 | 500 | 5.0E-03 | 6.0E-04 | 25 | 0.5 |
| EXAMPLE 13 | 3.5E-05 | 1.2E-06 | 1.0E+05 | 25 | 500 | 1.8E-02 | 6.0E-04 | 25 | 0.5 |
| EXAMPLE 14 | 5.0E-05 | 1.2E-06 | 1.0E+05 | 25 | 500 | 2.5E-02 | 6.0E-04 | 25 | 0.5 |
| EXAMPLE 15 | 5.0E-08 | 1.2E-06 | 1.0E+05 | 25 | 72 | 3.6E-06 | 8.6E-05 | 25 | 0.5 |
| EXAMPLE 16 | 3.5E-05 | 1.2E-06 | 1.0E+05 | 25 | 72 | 2.5E-03 | 8.6E-05 | 25 | 0.5 |
| EXAMPLE 17 | 1.5E-07 | 5.0E-08 | 1.0E+05 | 25 | 72 | 1.1E-05 | 3.6E-06 | 25 | 0.5 |
| EXAMPLE 18 | 1.5E-07 | 1.0E-07 | 1.0E+05 | 25 | 72 | 1.1E-05 | 7.2E-06 | 25 | 0.5 |
| EXAMPLE 19 | 1.5E-07 | 1.0E-05 | 1.0E+05 | 25 | 72 | 1.1E-05 | 7.2E-04 | 25 | 0.5 |
| EXAMPLE 20 | 1.5E-07 | 4.0E-05 | 1.0E+05 | 25 | 72 | 1.1E-05 | 2.9E-03 | 25 | 0.5 |
| EXAMPLE 21 | 1.5E-07 | 5.0E-05 | 1.0E+05 | 25 | 72 | 1.1E-05 | 3.6E-03 | 25 | 0.5 |
| EXAMPLE 22 | 1.5E-07 | 1.0E-04 | 1.0E+05 | 25 | 72 | 1.1E-05 | 7.2E-03 | 25 | 0.5 |
| EXAMPLE 23 | 1.5E-07 | 1.0E-05 | 1.0E+05 | 25 | 1500 | 2.3E-04 | 1.5E-02 | 25 | 0.5 |
| EXAMPLE 24 | 5.5E-07 | 4.0E-05 | 1.0E+05 | 25 | 1500 | 8.3E-04 | 6.0E-02 | 25 | 0.5 |

Fig. 10

|  | LOW-OXYGEN ATMOSPHERE | | | | | | | AIR | |
| --- | --- | --- | --- | --- | --- | --- | --- | --- | --- |
|  | OXYGEN LEVEL | WATER VAPOR LEVEL | TOTAL PRESSURE | TEMPER-ATURE | RETENTION TIME | OXYGEN LEVEL × TIME | WATER VAPOR LEVEL × TIME | TEMPER-ATURE | RETENTION TIME |
|  | g/L | g/L | Pa | °C | hrs. | hrs.×g×L | hrs.×g×L | °C | hrs. |
| EXAMPLE 25 | 1.5E-07 | 1.2E-06 | 1.0E+05 | 0 | 72 | 1.1E-05 | 8.6E-05 | 25 | 0.5 |
| EXAMPLE 26 | 1.5E-07 | 1.2E-06 | 1.0E+05 | 50 | 72 | 1.1E-05 | 8.6E-05 | 25 | 0.5 |
| EXAMPLE 27 | 1.5E-07 | 1.2E-06 | 1.0E+05 | 100 | 72 | 1.1E-05 | 8.6E-05 | 25 | 0.5 |
| EXAMPLE 28 | 1.5E-07 | 1.2E-06 | 1.0E+05 | 25 | 500 | 7.5E-05 | 6.0E-04 | 0 | 0.5 |
| EXAMPLE 29 | 1.5E-07 | 1.2E-06 | 1.0E+05 | 25 | 500 | 7.5E-05 | 6.0E-04 | 50 | 0.5 |
| EXAMPLE 30 | 1.5E-07 | 1.2E-06 | 1.0E+05 | 25 | 500 | 7.5E-05 | 6.0E-04 | 25 | 0.05 |
| EXAMPLE 31 | 1.5E-07 | 1.2E-06 | 1.0E+05 | 25 | 72 | 3.6E-03 | 6.0E-04 | 25 | 2 |
| EXAMPLE 32 | 3.0E-05 | 1.0E-03 | 1.0E+05 | 25 | 72 | 3.6E-03 | 7.2E-06 | 25 | 0.5 |
| EXAMPLE 33 | 5.0E-05 | 5.0E-08 | 1.0E+05 | 25 | 72 | 3.6E-03 | 3.6E-06 | 25 | 0.5 |
| EXAMPLE 34 | 2.5E-05 | 1.2E-06 | 1.0E+05 | 25 | 50 | 1.3E-03 | 6.0E-05 | 25 | 0.5 |
| EXAMPLE 35 | 1.5E-07 | 1.2E-06 | 1.0E+05 | 25 | 72 | 1.1E-05 | 8.6E-05 | 0 | 0.5 |
| EXAMPLE 36 | 1.5E-07 | 1.2E-06 | 1.0E+05 | 25 | 72 | 1.1E-05 | 8.6E-05 | 50 | 0.5 |
| EXAMPLE 37 | 1.5E-07 | 1.2E-06 | 1.0E+05 | 25 | 72 | 1.1E-05 | 8.6E-05 | 25 | 0.05 |
| EXAMPLE 38 | 1.5E-07 | 1.2E-06 | 1.0E+05 | 25 | 72 | 1.1E-05 | 8.6E-05 | 25 | 1 |
| EXAMPLE 39 | 1.5E-07 | 1.2E-06 | 1.0E+05 | 25 | 72 | 1.1E-05 | 8.6E-05 | 25 | 2 |
| EXAMPLE 40 | 1.5E-07 | 1.2E-06 | 1.0E+02 | 25 | 72 | 1.1E-05 | 8.6E-05 | 25 | 0.5 |
| EXAMPLE 41 | 1.5E-07 | 1.2E-06 | 1.0E+05 | 25 | 72 | 1.1E-05 | 8.6E-05 | 25 | 0.5 |
| REFERENCE EXAMPLE 1 | 1.5E-07 | 1.2E-06 | 1.0E+05 | 25 | 2000 | 3.0E-04 | 2.4E-03 | 25 | 0.5 |
| COMPARATIVE EXAMPLE 1 | 1.5E-07 | 1.2E-06 | 1.0E+05 | 25 | 0.5 | 7.5E-08 | 6.0E-07 | 25 | 0.5 |
| COMPARATIVE EXAMPLE 2 | 1.0E-09 | 1.2E-06 | 1.0E+05 | 25 | 1000 | 1.0E-06 | 1.2E-03 | 25 | 0.5 |
| COMPARATIVE EXAMPLE 3 | 7.0E-05 | 1.2E-06 | 1.0E+05 | 25 | 3 | 2.1E-04 | 3.6E-06 | 25 | 0.5 |
| COMPARATIVE EXAMPLE 4 | 1.0E-04 | 1.2E-06 | 1.0E+05 | 25 | 1 | 1.0E-04 | 1.2E-06 | 25 | 0.5 |
| COMPARATIVE EXAMPLE 5 | 1.5E-07 | 1.2E-06 | 1.0E+05 | 25 | 72 | 1.1E-05 | 8.6E-05 | 25 | 0.5 |

Fig. 11

| | CuO CHECK | Voc | LIGHT TRANSMISSIVITY |
|---|---|---|---|
| EXAMPLE 1 | B | B | A |
| EXAMPLE 2 | B | B | A |
| EXAMPLE 3 | B | B | A |
| EXAMPLE 4 | B | B | A |
| EXAMPLE 5 | B | B | A |
| EXAMPLE 6 | A | A | A |
| EXAMPLE 7 | A | A | A |
| EXAMPLE 8 | A | A | A |
| EXAMPLE 9 | A | A | A |
| EXAMPLE 10 | A | A | A |
| EXAMPLE 11 | A | A | A |
| EXAMPLE 12 | A | A | A |
| EXAMPLE 13 | A | A | A |
| EXAMPLE 14 | A | A | A |
| EXAMPLE 15 | B | B | A |
| EXAMPLE 16 | B | B | A |
| EXAMPLE 17 | B | B | A |
| EXAMPLE 18 | B | B | A |
| EXAMPLE 19 | B | B | A |
| EXAMPLE 20 | B | B | A |
| EXAMPLE 21 | B | B | A |
| EXAMPLE 22 | B | B | A |
| EXAMPLE 23 | A | A | A |
| EXAMPLE 24 | A | A | A |
| EXAMPLE 25 | B | B | A |
| EXAMPLE 26 | A | A | A |
| EXAMPLE 27 | A | A | A |
| EXAMPLE 28 | A | A | A |
| EXAMPLE 29 | A | A | A |
| EXAMPLE 30 | A | A | A |
| EXAMPLE 31 | A | A | A |
| EXAMPLE 32 | A | A | A |
| EXAMPLE 33 | A | A | A |
| EXAMPLE 34 | B | B | A |
| EXAMPLE 35 | B | B | A |
| EXAMPLE 36 | B | B | A |
| EXAMPLE 37 | B | B | A |
| EXAMPLE 38 | B | B | A |
| EXAMPLE 39 | B | B | A |
| EXAMPLE 40 | B | B | A |
| EXAMPLE 41 | B | B | A |
| REFERENCE EXAMPLE 1 | A | A | A |
| COMPARATIVE EXAMPLE 1 | C | C | A |
| COMPARATIVE EXAMPLE 2 | C | C | A |
| COMPARATIVE EXAMPLE 3 | A | C | B |
| COMPARATIVE EXAMPLE 4 | A | C | B |
| COMPARATIVE EXAMPLE 5 | C | C | A |

Fig.12

PROCESS FOR MANUFACTURING MULTILAYERED THIN FILM, METHOD OF MANUFACTURING SOLAR CELL, AND METHOD FOR MANUFACTURING SOLAR CELL MODULE

CROSS-REFERENCE TO RELATED APPLICATIONS

This application is a Continuation application of PCT International Application PCT/JP2020/032088, the International Filing Date of which is Aug. 25, 2020, which is based upon and claims the benefit of priority from Japanese Application 2020-051555, the filing Date of which is Mar. 23, 2020, the entire contents of both of which are incorporated herein by reference.

FIELD

Embodiments described herein relate generally to a process for manufacturing a multilayered thin film, a method of manufacturing a solar cell, and a method for manufacturing a solar cell module.

BACKGROUND

Examples of a highly efficient solar cell include a multijunction (tandem) solar cell. The tandem solar cell can utilize a cell having a high spectral sensitivity for each wavelength band, and the efficiency can be thus made higher than that of a single junction solar cell. A cuprous oxide compound, which is an inexpensive material and has a wide band gap, is promising as a top cell of the tandem solar cell. Meanwhile, although previous cuprous oxide solar cells manufactured by oxidizing copper foil reportedly have an efficiency of about 8%, the efficiency is lower than the theoretical maximum efficiency. This may be because while copper foil is oxidized and a heterogenous phase, such as copper oxide, on the top surface is then removed by etching, it is impossible to remove the phase completely and constituent elements in the etching solution remain. Consequently, a favorable p-n junction cannot be formed. In addition, it is necessary in this procedure to first oxidize foil with a thickness of about 0.1 mm and then polish it to about 20 μm. Thus, it is difficult to make the area large.

As a process for manufacturing a cuprous oxide thin film, sputtering has been known. This process has been used for manufacturing the cuprous oxide thin film in some reports. However, the conversion efficiency should be improved further.

BRIEF DESCRIPTION OF THE DRAWINGS

FIG. 10 is a table for Examples;

FIG. 11 is a table for Examples, Reference Example, and Comparative Examples; and FIG. 12 is a table for Examples, Reference Example, and Comparative Examples.

DETAILED DESCRIPTION

A process for manufacturing a multilayered thin film of an embodiment, includes: forming a photovoltaic conversion layer, comprising $Cu_2O$ as a main component, on a first transparent electrode; and placing, under a first atmosphere at an oxygen level of from $5.0 \times 10^{-8}$ [g/L] to $5.0 \times 10^{-5}$ [g/L] for 1 h to 1600 h, a member having the photovoltaic conversion layer formed on the first transparent electrode.

First Embodiment

Figure 1:
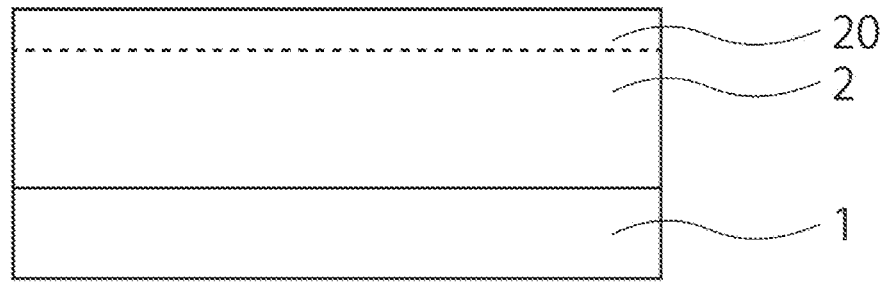
FIG. 1 is a schematic cross-sectional view of a multilayered thin film in an embodiment.

The first embodiment pertains to a multilayered thin film and a process for manufacturing the multilayered thin film. FIG. 1 is a schematic cross-sectional view illustrating a multilayered thin film 100. The multilayered thin film 100, shown in FIG. 1, includes: a first transparent electrode 1; and a photovoltaic conversion layer 2 formed on the first transparent electrode 1. A surface of the photovoltaic conversion layer 2, which surface is opposite to the side of the first transparent electrode 1, has a CuO-containing region 20. Unless otherwise indicated herein, values at 25° C. and 1 atm are indicated.

The first transparent electrode 1 is a layer stacked on the photovoltaic conversion layer 2. In FIG. 1, the first transparent electrode 1 is in direct contact with the photovoltaic conversion layer 2. The main surface of the first transparent electrode 1 faces the main surface of the photovoltaic conversion layer 2, and has an interface. The entire surface of the photovoltaic conversion layer 2, which surface faces the first transparent electrode 1, is preferably in direct contact with the first transparent electrode 1. The first transparent electrode 1 is a p-type electrode in direct contact with the p-type photovoltaic conversion layer 2. The first transparent electrode 1 has, for instance, a thickness of preferably from 100 nm to 1000 nm.

The first transparent electrode 1 preferably includes a transparent conductive oxide film (semiconductor conductive film). Examples of the transparent conductive oxide film include, but are not particularly limited to, Indium Tin Oxide (ITO), Al-doped Zinc Oxide (AZO), Boron-doped Zinc Oxide (BZO), Gallium-doped Zinc Oxide (GZO), Fluorine-doped Tin Oxide (FTO), Antimony-doped Tin Oxide (ATO), Titanium-doped Indium Oxide (ITiO), Indium Zinc Oxide (IZO), Indium Gallium Zinc Oxide (IGZO), Ta-doped Tin Oxide ($SnO_2$:Ta), Nb-doped Tin Oxide ($SnO_2$:Nb), W-doped Tin Oxide ($SnO_2$:W), Mo-doped Tin Oxide ($SnO_2$:Mo), F-doped Tin Oxide ($SnO_2$:F), or Hydrogen-doped Indium Oxide (IOH). The transparent conductive oxide film may be a multilayered film having a plurality of films. The multilayered film may include, for instance, a tin oxide film in addition to the above oxide film. A dopant in, for instance, a tin oxide film is at least one kind selected from the group consisting of In, Si, Ge, Ti, Cu, Sb, Nb, F, Ta, W, Mo, Br, I, and Cl, and is not particularly limited. The photovoltaic conversion layer 2 is preferably in direct contact with a transparent conductive oxide film included in the first transparent electrode 1.

It is preferable that the first transparent electrode 1 includes a multilayer structure in which an indium tin oxide film is layered on a doped tin oxide film. Specifically, the first transparent electrode 1 preferably includes at least one multilayer structure selected from the group consisting of: a multilayered film having an indium tin oxide film and an antimony-doped tin oxide film; a multilayered film having an indium tin oxide film and a fluorine-doped tin oxide film; a multilayered film having an indium tin oxide film and a tantalum-doped tin oxide film; and a multilayered film having an indium tin oxide film and a niobium-doped tin oxide film. If the first transparent electrode 1 includes a doped tin oxide film, the doped tin oxide film is preferably in direct contact with the photovoltaic conversion layer 2.

The first transparent electrode 1 may include a metal film with a thickness of 10 nm or less. The metal film is, for instance, at least one film selected from the group consisting of Mo, Au, Cu, Ag, Al, Ta, Pt, Ru, and W, and is not particularly limited. Meanwhile, the first transparent electrode 1 may be an electrode provided with a dot-like, line-shaped, or meshed metal at an upper or lower portion of the transparent conductive oxide film. At this time, the dot-like, line-shaped, or meshed metal is arranged between the transparent conductive oxide film and the photovoltaic conversion layer 2. The dot-like, line-shaped, or meshed metal preferably has an aperture ratio of 50% or higher with respect to the transparent conductive oxide film. The dot-like, line-shaped, or meshed metal is, for instance, Mo, Au, Cu, Ag, Al, Ta, Pt, Ru, or W, and is not particularly limited. If the dot-like, line-shaped, or meshed metal is provided, the transparency is secured. Thus, the thickness of the metal film is not limited.

From the viewpoint of improving the crystallinity of the photovoltaic conversion layer 2, it is preferable that the first transparent electrode 1 surface, on which the photovoltaic conversion layer 2 is formed, is a metal oxide thin film (transparent conductive oxide film). The metal of the metal oxide containing Sn as a main component is preferably 90 atom % or more of Sn. The metal oxide thin film containing Sn as a main component may include, in addition to Sn, at least one metal (metal oxide) selected from the group consisting of Zn, Al, Ga, In, Si, Ge, Ti, Cu, Sb, Nb, F, and Ta. When the photovoltaic conversion layer 2 is directly deposited on the metal oxide (e.g., ITO) film containing In as a main component, the resulting multilayered body including the ITO film and a substrate is easily deformed at a high temperature. Thus, it is unsuitable to deposit a $Cu_2O$ film on the ITO film.

The photovoltaic conversion layer 2 is a p-type compound semiconductor layer primarily containing cuprous oxide. Cuprous oxide is expressed as $Cu_2O$, which is an oxide semiconductor. The cuprous oxide is non-doped or doped cuprous oxide. The photovoltaic conversion layer 2 has, for instance, a thickness of from 500 nm to 10 μm. The photovoltaic conversion layer 2 has a thickness of preferably from 1000 nm to 5 μm and more preferably from 1500 nm to 3 μm. The thickness of the photovoltaic conversion layer 2 can be determined by, for instance, cross-sectional observation.

It is preferable that the photovoltaic conversion layer 2 abundantly contains large cuprous oxide crystals and excels in the conversion efficiency and the light transmissivity of solar cell using the multilayered thin film 100. If the multilayered thin film 100 is manufactured by the process of this embodiment, the cuprous oxide crystals become large, which contribute to improving the conversion efficiency and the light transmissivity. It is preferable that 95 wt % or more of the photovoltaic conversion layer 2 includes cuprous oxide as a component. It is more preferable that 98 wt % or more of the photovoltaic conversion layer 2 includes cuprous oxide as a component. That is, it is preferable that the photovoltaic conversion layer 2 is almost (substantially) free of a heterogenous phase such as CuO and/or Cu. If the photovoltaic conversion layer 2 does not include any heterogenous phase such as CuO and/or Cu and is substantially a $Cu_2O$ single phase thin film, it is preferable because of very high light transmissivity. That the photovoltaic conversion layer 2 is substantially a $Cu_2O$ single phase may be checked by measuring photo luminescence (PL method).

It is preferable that the photovoltaic conversion layer 2 contains Cu in an amount of from 60.0 atom % to 67.0 atom % and O (oxygen) in an amount of from 32.5 atom % to 34.0 atom %. In addition to Cu and oxygen, an element(s) selected from the group consisting of metals other than Cu, dopants, and impurities may be included. The photovoltaic conversion layer 2 may include, as an oxide, a metal other than Cu, and the photovoltaic conversion layer 2 may be a composite oxide. The metal(s) included in the photovoltaic conversion layer 2 is, in addition to Cu, at least one metal selected from the group consisting of Sn, Sb, Ag, Li, Na, K, Cs, Rb, Al, Ga, In, Zn, Mg, and Ca. If at least one metal selected from the group consisting of Ag, Li, Na, K, Cs, Rb, Al, Ga, In, Zn, Mg, Ta, and Ca is included in addition to Cu, the band gap in the photovoltaic conversion layer 2 is adjustable. The first transparent electrode 1 side of the photovoltaic conversion layer 2 may have a $P^+$-type region where at least one p-type dopant selected from any of Si, Ge, or N is dispersed at a high concentration.

The photovoltaic conversion layer 2 preferably has a band gap of from 2.0 eV to 2.2 eV. The band gap in such a range allows for efficient use of sunlight in both a top cell and a bottom cell of a multi-junction solar cell in which a solar cell using Si in a light-absorbing layer is used as the bottom cell and a solar cell using a thin film in this embodiment is used as the top cell. The composition of the photovoltaic conversion layer 2 may be represented by $Cu_aM_bO_c$. M is at least one element selected from the group consisting of Si, Ge, N, Sn, Sb, Ag, Li, Na, K, Cs, Rb, Al, Ga, In, Zn, Mg, Ta, and Ca. It is preferable that a, b, and c satisfy $1.80 \leq a \leq 2.01$, $0.00 \leq b \leq 0.20$, and $0.98 \leq c \leq 1.02$. The above composition ratio in the photovoltaic conversion layer 2 is a composition ratio in the entire photovoltaic conversion layer 2. In addition, the above compound composition ratio in the photovoltaic conversion layer 2 is preferably met with respect to the whole photovoltaic conversion layer 2. The photovoltaic conversion layer 2 may include another additive(s).

The CuO-containing region 20 is present on a side provided with an n-type layer. A solar cell manufactured using the multilayered thin film 100 including the photovoltaic conversion layer 2, a surface of which has a CuO-containing very thin region, has a higher open circuit voltage (Voc) than a solar cell manufactured using a multilayered thin film free of such a CuO-containing region 20. The CuO-containing region 20 is a region with a depth of up to 5 nm in the inward direction of the photovoltaic conversion layer 2 from the surface opposite to the first transparent electrode 1 side of the photovoltaic conversion layer 2. The CuO-containing region 20 includes CuO in an amount of 1.0 mol % or more. It is preferable that a ratio of $Cu_2O$ to $Cu_2O$, CuO, and Cu in the photovoltaic conversion layer 2 excluding the CuO-containing region 20 ([mass of $Cu_2O$]/([mass of $Cu_2O$]+

[mass of CuO]+[mass of Cu])) is from 99.5% to 100.0%. The CuO-containing region 20 is preferably present as only a thin surface region as possible. Accordingly, the CuO-containing region 20 is preferably a region with a depth of up to 3 nm in the inward direction of the photovoltaic conversion layer 2 from the surface opposite to the first transparent electrode 1 side of the photovoltaic conversion layer 2, and is more preferably a region with a depth of up to 1 nm in the inward direction of the photovoltaic conversion layer 2 from the surface opposite to the first transparent electrode 1 side of the photovoltaic conversion layer 2. A region with a depth (origin) of 20 nm to a depth of 25 nm in the direction toward the side of the first transparent electrode 1 from the surface of the photovoltaic conversion layer 2 preferably has a CuO concentration of 0.5 mol % or less.

Because of the presence of CuO in the very thin region, the CuO abundance ratio in the CuO-containing region 20 may be high. Regarding the ratio of CuO to $Cu_2O$ and CuO in the CuO-containing region 20 ([the number of moles of CuO in the CuO-containing region 20]/([the number of moles of $Cu_2O$ in the CuO-containing region 20]+[the number of moles of CuO in the CuO-containing region 20])), CuO is preferably included in an amount of from 1.0 mol % to 100 mol % and CuO is more preferably included in an amount of from 20 mol % to 100 mol %. It is preferable that the ratio of $Cu_2O$ to $Cu_2O$ and Cu in the CuO-containing region 20 ([the number of moles of $Cu_2O$ in the CuO-containing region 20]/([the number of moles of $Cu_2O$ in the CuO-containing region 20]+[the number of moles of Cu in the CuO-containing region 20])) is from 99.5 mol % to 100.0 mol % (excluding the case where the CuO-containing region 20 includes CuO in an amount of 100 mol %). The composition of the photovoltaic conversion layer 2 including the CuO-containing region 20 can be checked by analyzing the multilayered thin film 100 by XPS (X-ray Photoelectron Spectroscopy) or RBS (Rutherford Back-Scattering Spectroscopy).

Figure 2:
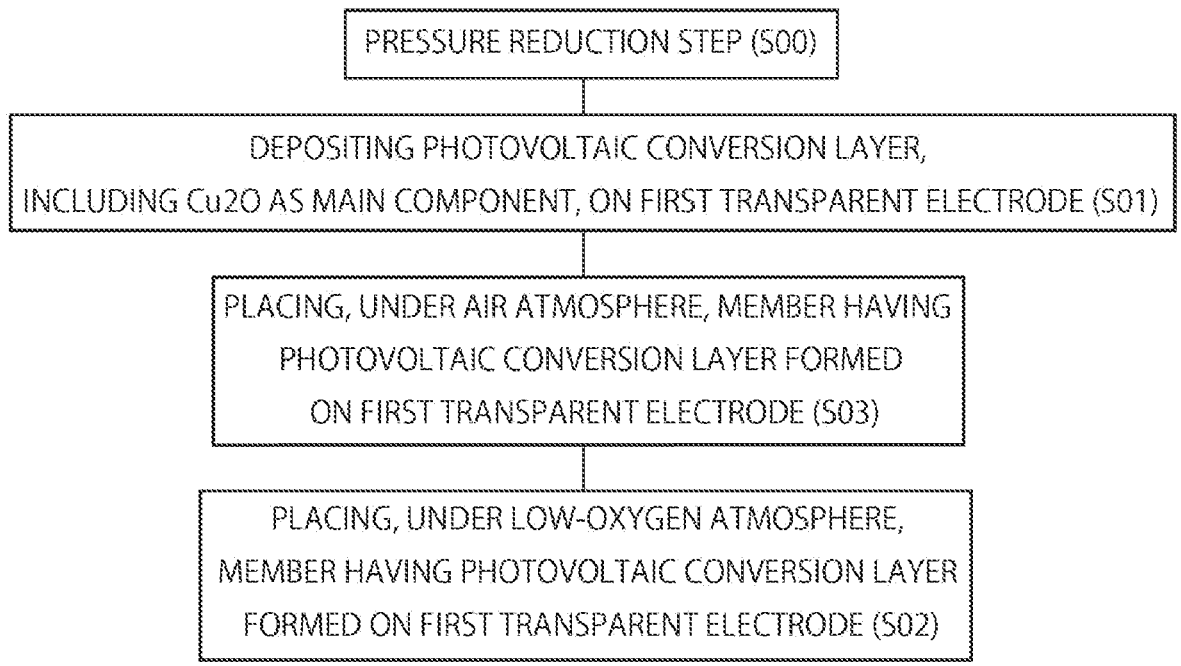
FIG. 2 is a flowchart illustrating a process for manufacturing a multilayered thin film according to an embodiment.

Next, a process for manufacturing the multilayered thin film 100 will be described. FIG. 2 is a flowchart illustrating a process for manufacturing the multilayered thin film 100. This process for manufacturing the multilayered thin film 100 includes: a step (S01) of depositing a photovoltaic conversion layer 2, including $Cu_2O$ as a main component, on a first transparent electrode 1; and a step (S02) of placing, under a low-oxygen atmosphere (first atmosphere) at an oxygen level of from $5.0 \times 10^{-3}$ [Pa] to 5.0 [Pa] for 1 h to 1600 h, a member having the photovoltaic conversion layer 2 formed on the first transparent electrode 1. A pressure reduction step (S00) may be optionally carried out before the step (S01) of depositing the photovoltaic conversion layer 2. In the step (S02) of placing, under a low-oxygen atmosphere (first atmosphere), a member having the photovoltaic conversion layer 2 formed on the first transparent electrode 1, the member is, for instance, retained in the low-oxygen atmosphere. Hereinafter, for convenience, the wording "placing, under a low-oxygen atmosphere, a member having the photovoltaic conversion layer 2 formed on the first transparent electrode 1" is expressed such that the member having the photovoltaic conversion layer 2 formed on the first transparent electrode 1 is retained in the low-oxygen atmosphere. It is preferable to retain this member in a chamber in which the oxygen level and the water vapor level can be controlled.

It is preferable that the photovoltaic conversion layer 2 containing cuprous oxide as a main component is deposited by sputtering in an oxidizing atmosphere while Cu is used as a target. The photovoltaic conversion layer 2 is preferably deposited by sputtering at a high temperature. In the multilayered thin film 100 manufactured by the the process of this embodiment, the photovoltaic conversion layer 2 includes $Cu_2O$ with a large grain size, which contributes to improving the solar cell conversion efficiency.

The target containing Cu as a main component is a target containing Cu with a purity of 99.99%. The Cu purity is preferably 99.995% or higher and more preferably 99.999% or higher. Use of the high-purity Cu as a target allows for substantially a $Cu_2O$ single phase photovoltaic conversion layer 2. If the target contains an element (e.g., Si) included in the photovoltaic conversion layer 2, the Cu purity is not limited to the above.

It is preferable that the atmosphere during sputtering is an oxidizing atmosphere in which inert gas and oxygen gas are mixed. It is more preferable that the atmosphere during sputtering is an atmosphere including inert gas and oxygen gas. Preferable examples of the inert gas include nitrogen gas, argon gas, or mixed gas of nitrogen gas and argon gas.

Figure 3:
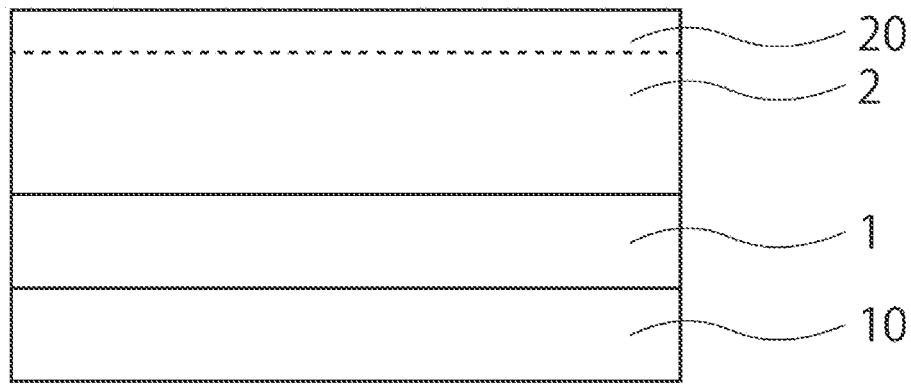
FIG. 3 is a schematic cross-sectional view of a multilayered thin film in an embodiment.

For instance, sputtering is performed on a base material in which the first transparent electrode 1 is formed on a glass substrate 10, etc. FIG. 3 is a schematic cross-sectional view illustrating the multilayered thin film 100 including the substrate 10. The sputtering is performed on a surface of the first transparent electrode 1 such that the photovoltaic conversion layer 2 is deposited on the first transparent electrode 1. It is preferable that before the sputtering, the step (S00) of reducing the pressure in a chamber, in which the first transparent electrode 1 is placed, to $5.0 \times 10^{-3}$ [Pa] or lower. The pressure reduction step (S00) may be carried out in a chamber in which sputtering is performed or may be carried out in a sub-chamber. No oxygen is injected during the pressure reduction step, which is different from the sputtering step. The substrate 10 may be used as a substrate for a solar cell using the thin film 100. The first transparent electrode 1 is formed on the substrate 10 by, for instance, sputtering. Preferable examples of a material for the substrate 10 used include glass such as white plate glass, soda lime glass, chemically reinforced glass, or quartz glass. In addition, an organic material such as acryl, polycarbonate, or polyimide may be used for the substrate 10.

The $Cu_2O$ (photovoltaic conversion layer 2) film thickness may be set to T. In this case, it is preferable that the average diameter of $Cu_2O$ crystals in the film thickness direction of the photovoltaic conversion layer 2, excluding a micro $Cu_2O$ phase of $Cu_2O$ crystals with a diameter of 50 nm or less in the film thickness direction, is from 0.7 T to 1.0 T. When the micro $Cu_2O$ phase is abundant, there are many grain boundaries, which likely cause the conversion efficiency to decrease. It is preferable that the cross-sectional area of the micro $Cu_2O$ phase of the $Cu_2O$ crystals with a diameter of 50 nm or less in the film thickness direction accounts for 10% or less of the cross-sectional area of the photovoltaic conversion layer 2. The photovoltaic conversion layer 2 may include $Cu_2O$ crystals with a small grain size. In this case, oxidation proceeds in a deep portion of the photovoltaic conversion layer 2 during the following step of retaining under a low-oxygen atmosphere. This causes a heterogenous phase, resulting in a decrease in the crystallinity of the photovoltaic conversion layer 2. From the viewpoint of restricting an area having the CuO-containing region 20 to a very thin surface region of the photovoltaic conversion layer 2, it is preferable to include many large $Cu_2O$ crystals. Specifically, it is preferable that crystals with a diameter of 50 nm or less accounts for 10% or less of the cross-sectional area of the photovoltaic conversion layer 2.

The absorption wavelength band of CuO overlaps with the absorption wavelength band of a solar cell using Si. From the viewpoint of applying the multilayered thin film 100 in this embodiment to a multi-junction solar cell, the photovoltaic conversion layer 2 preferably has $Cu_2O$ with a large grain size.

Further, when the photovoltaic conversion layer 2 is deposited on a metal oxide film containing Sn as a main component, Sn spreads in the $Cu_2O$ film during deposition of the $Cu_2O$ film. This makes the grain size larger than when sputtering is performed on a glass substrate at the same temperature, thereby capable of increasing the crystallinity. The sputtering of $Cu_2O$ on the metal oxide film containing Sn as a main component while heating allows for deposition of the $Cu_2O$ film having $Cu_2O$ crystals grown to a size comparable to the film thickness. This cannot be achieved by sputtering without heating. As described above, this $Cu_2O$ film is substantially a $Cu_2O$ single phase, and is thus ideal as a photovoltaic conversion layer of a transparent solar cell because of having favorable crystallinity over the entire film.

Oxidation of a Cu sheet at a high temperature makes it possible to deposit a thick $Cu_2O$ film in which $Cu_2O$ is grown to a size comparable to the film thickness. Meanwhile, in this case, the oxidation of a Cu sheet is followed by formation of a transparent electrode on the $Cu_2O$ film. If a transparent electrode is formed directly on the $Cu_2O$ film by sputtering, the resulting $Cu_2O$ crystals are disintegrated. This causes a decrease in the power generation efficiency when a solar cell is manufactured. The multilayered thin film in this embodiment is obtained by depositing the photovoltaic conversion layer 2 on the transparent electrode 1. Hence, it is possible to keep a good-quality photovoltaic conversion layer 2 after a solar cell is manufactured.

In this embodiment, the photovoltaic conversion layer 2 is not deposited on a glass substrate, but the photovoltaic conversion layer 2 is deposited on the first transparent electrode 1. If the photovoltaic conversion layer 2 is deposited on the glass substrate, impurities present in the glass diffuse into the photovoltaic conversion layer 2. This may cause a change in the film deposition conditions or a decrease in the film quality of the photovoltaic conversion layer 2 because the impurity level is formed. In addition, if the photovoltaic conversion layer 2 is deposited on a metal film that can be used as an electrode, the resulting multilayered thin film 100 fails to have light transmissivity. In this embodiment, the light transmissivity is an essential characteristic. Thus, the multilayered thin film obtained by depositing the photovoltaic conversion layer 2 on a metal film is impractical from the viewpoint of light transmissivity. If some glass part appears after scribing, it causes almost no trouble. The case where a cuprous oxide solar cell is used singly does not apply to the above.

It is optional to perform heating after the sputtering. The heating is preferably performed while the multilayered member is retained in a chamber at from room temperature to the sputtering temperature for a desired period.

Next, the step (S02) of retaining under a low-oxygen atmosphere will be described. A member having the photovoltaic conversion layer 2 formed on the first transparent electrode 1 is retained under a low-oxygen atmosphere. The retention under a low-oxygen atmosphere makes it possible to form the CuO-containing region 20 in a very thin surface region of the photovoltaic conversion layer 2. The low-oxygen atmosphere is preferably an atmosphere at an oxygen level (mass/volume) of $5.0 \times 10^{-8}$ [g/L] to $5.0 \times 10^{-5}$ [g/L] and more preferably an atmosphere at an oxygen level of $5.0 \times 10^{-8}$ [g/L] to $3.5 \times 10^{-5}$ [g/L]. The member having the photovoltaic conversion layer 2 formed on the first transparent electrode 1 under a low-oxygen atmosphere may be retained under a low-oxygen atmosphere. This makes it possible to form the CuO-containing region 20 in a very thin surface region of the photovoltaic conversion layer 2. If the member is retained for a short period in an atmosphere at a high oxygen level, such as in an air atmosphere, the very thin CuO-containing region 20 is not formed at a surface of the photovoltaic conversion layer 2. By contrast, if the member is retained for a long period in an atmosphere at a high oxygen level, such as in an air atmosphere, not only the surface, but also an inner portion of the photovoltaic conversion layer 2 has CuO. Hence, before the step (S02) of retaining, under a low-oxygen atmosphere, a member having the photovoltaic conversion layer 2 formed on the first transparent electrode 1, the step (S03) of placing, under an air atmosphere (second atmosphere) at from 0° C. to 50° C., the member having the photovoltaic conversion layer 2 formed on the first transparent electrode 1 may be carried out for 1 h or less.

The low-oxygen atmosphere optionally contains ozone. The oxygen level is the total of concentrations of oxygen and ozone molecules. For instance, the oxygen level and the water vapor level in the air may be lowered to give a low-oxygen atmosphere. If other oxidizing gas and/or reducing gas are abundantly included in the low-oxygen atmosphere, it is unsuitable to appropriately oxidize a very thin surface region of the $Cu_2O$ film. Thus, in the case of obtaining a low-oxygen atmosphere from the air, it is preferable that inert gas accounts for 95% or more of the total pressure [Pa] of the low-oxygen atmosphere; it is more preferable that inert gas accounts for 99% or more of the total pressure [Pa] of the low-oxygen atmosphere; and it is still more preferable that inert gas accounts for 99.9% or more of the total pressure [Pa] of the low-oxygen atmosphere. Note that carbon dioxide is acidic and is unlikely to oxidize $Cu_2O$. Accordingly, the level of carbon dioxide is not particularly limited.

The total pressure of the low-oxygen atmosphere is not particularly limited. When the low-oxygen atmosphere is obtained by decreasing the level of oxygen in the air, it is typically preferable that the total pressure is set to be from $8.0 \times 10^4$ [Pa] to $1.2 \times 10^5$ [Pa]. If a member having the photovoltaic conversion layer 2 formed on the first transparent electrode 1 in a vacuum chamber is retained under a low-oxygen atmosphere, the total pressure of the low-oxygen atmosphere is preferably 100 [Pa] or less.

A member having the photovoltaic conversion layer 2 formed on the first transparent electrode 1 may be collected from a film deposition room, in which the photovoltaic conversion layer 2 has been deposited on the first transparent electrode 1, and may be transferred from the air atmosphere and then retained in a low-oxygen atmosphere. In this case, the oxygen level and the water vapor level are preferably lowered such that the above- or below-described atmosphere is achieved within 1 h after the member having the photovoltaic conversion layer 2 formed on the first transparent electrode 1 is transferred to a chamber with a low-oxygen atmosphere.

Meanwhile, a member having the photovoltaic conversion layer 2 formed on the first transparent electrode 1 may be retained under a low-oxygen atmosphere. This retention time is preferably from 1 h to 1600 h. If the retention time is less than 1 h, almost no CuO is generated. In addition, even if the retention time is extended, a further increase in the open circuit voltage is small. Besides, the extended retention time rather affects the productivity more. Then, the retention time is preferably from 1 h to 1600 h.

During the step of retaining under a low-oxygen atmosphere, the water vapor level (mass/volume) in the low-oxygen atmosphere is preferably from $5.0 \times 10^{-8}$ [g/L] to $5.0 \times 10^{-5}$ [g/L] and more preferably from $5.0 \times 10^{-8}$ [g/L] to $4.0 \times 10^{-5}$ [g/L]. If the water vapor level in the low-oxygen atmosphere is high, oxidation is likely to proceed and a deep portion of the photovoltaic conversion layer 2 is also amenable to oxidation. Then, it is preferable to retain the photovoltaic conversion layer 2 in an atmosphere where the water vapor level as well as the oxygen level are low.

The temperature of a low-oxygen atmosphere during the step of retaining under a low-oxygen atmosphere is preferably from 0° C. to 100° C. If the temperature at the time of retaining under a low-oxygen atmosphere is too low, $Cu_2O$ oxidation at the surface of the photovoltaic conversion layer 2 hardly proceeds. By contrast, if the temperature at the time of retaining under a low-oxygen atmosphere is too high, an oxidation reaction occurs even at a deep portion of the photovoltaic conversion layer 2. Accordingly, a reaction mimicking a reaction during retention in the air for a long period should occur. Thus, the temperature of a low-oxygen atmosphere during the step of retaining under a low-oxygen atmosphere is preferably from 0° C. to 50° C.

If the oxygen level, the water vapor level, and the temperature are close to the lower limits of the above ranges, oxidation at the surface of the photovoltaic conversion layer 2 is unlikely to proceed. In addition, generation of CuO is very small in a short period, and as a result of which Voc hardly increases. Accordingly, the retention time in the low-oxygen atmosphere is preferably from 72 h to 1600 h.

If the oxygen level, the water vapor level, and the temperature are close to the upper limits of the above ranges, oxidation at the surface of the photovoltaic conversion layer 2 proceeds excessively. As a result, the film quality of the photovoltaic conversion layer 2 decreases in some cases. Accordingly, the retention time in the low-oxygen atmosphere is preferably from 1 h to 1000 h.

From the viewpoint of appropriately oxidizing a very thin surface region of the photovoltaic conversion layer 2, the retention time in the low-oxygen atmosphere is preferably from 72 h to 1000 h and more preferably from 500 h to 1000 h.

When the retention time in a low-oxygen atmosphere during the step of retaining under the low-oxygen atmosphere is defined as t [h], the oxygen level in the low-oxygen atmosphere is defined as $C_O$ [g/L], and the water vapor level in the low-oxygen atmosphere is defined as $C_W$ [g/L], it is preferable to satisfy $1.0 \times 10^{-7}$ [h·g/L]$\leq t \times C_O$ [h·g/L]$\leq 1.6 \times 10^{-3}$ [h·g/L] and $1.0 \times 10^{-7}$ [h·g/L]$\leq t \times C_W$ [h·g/L]$\leq 6.5 \times 10^{-2}$ [h·g/L]; it is more preferable to satisfy $1.0 \times 10^{-6}$ [h·g/L]$\leq t \times C_O$ [h·g/L]$\leq 2.5 \times 10^{-4}$ [h·g/L] and $1.0 \times 10^{-6}$ [h·g/L]$\leq t \times C_W$ [h·g/L]$\leq 2.0 \times 10^{-3}$ [h·g/L]; and it is still more preferable to satisfy $1.0 \times 10^{-5}$ [h·g/L]$\leq t \times C_O$ [h·g/L]$\leq 2.5 \times 10^{-4}$ [h·g/L] and $5.0 \times 10^{-5}$ [h·g/L]$\leq t \times C_W$ [h·g/L]$\leq 2.5 \times 10^{-4}$ [h·g/L]. If the oxygen level and the water vapor level are high, even a shorter retention time likely causes CuO to be formed on a surface of the photovoltaic conversion layer 2. If the oxygen level and the water vapor level are low, a longer retention time likely causes CuO to be formed on a surface of the photovoltaic conversion layer 2 so as to increase Voc when a solar cell is manufactured. In view of the oxygen level and the water vapor level, the retention time is preferably selected so as to satisfy the above ranges. The product of the time and the oxygen level or the water vapor level means the product of the time and the average oxygen level or the average water vapor level during retention in the low-oxygen atmosphere.

The oxygen level in gas (a low-oxygen atmosphere) may be determined from the oxygen level in the gas by using, for instance, a galvanic cell type oxygen sensor or a zirconia oxide sensor. In addition, the water vapor level in gas (a low-oxygen atmosphere) may be determined from the dew point and the temperature as measured using, for instance, a dew point meter of capacitance type or specular reflection type.

Before the step (S02) of retaining, under a low-oxygen atmosphere, a member having the photovoltaic conversion layer 2 formed on the first transparent electrode 1, the step (S03) of placing, under an air atmosphere (second atmosphere) at from 0° C. to 50° C., the member having the photovoltaic conversion layer 2 formed on the first transparent electrode 1 may be carried out for 1 h or less.

In the multilayered thin film 100 manufactured by such a process, the transmissivity of light at a wavelength of from 700 nm to 1000 nm is 50% or higher. Thus, the multilayered thin film 100 has excellent light transmissivity. The multilayered thin film 100 with excellent light transmissivity is fit for a light transmitting solar cell and/or a top cell of a multi-junction solar cell in which even a bottom cell can efficiently generate power.

Second Embodiment

Figure 4:
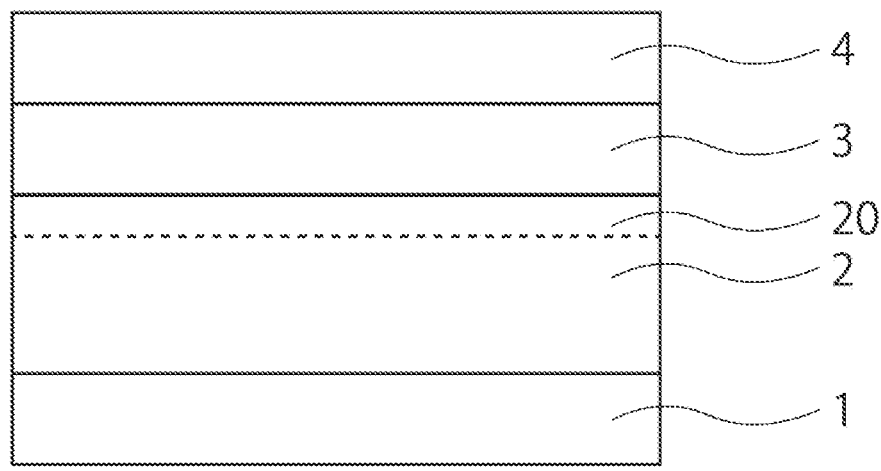
FIG. 4 is a schematic cross-sectional view of a solar cell in an embodiment.

The second embodiment pertains to a solar cell and a method of manufacturing the solar cell. FIG. 4 is a schematic cross-sectional view illustrating a solar cell 200. The solar cell 200, shown in FIG. 4, includes: a first transparent electrode 1; a photovoltaic conversion layer 2; an n-type layer 3; and a second transparent electrode 4. A multilayered body obtained by stacking the first transparent electrode 1 and the photovoltaic conversion layer 2 is the multilayered thin film 100 in the first embodiment. The photovoltaic conversion layer 2 is disposed between the first transparent electrode 1 and the n-type layer 3. The n-type layer 3 is disposed between the photovoltaic conversion layer 2 and the second transparent electrode 4. The photovoltaic conversion layer 2 and the n-type layer 3 are used to form a p-n junction. The first transparent electrode 1 and the photovoltaic conversion layer 2 are the same as in the first embodiment and the description is thus omitted. For instance, an intermediate layer (not shown) may be disposed between the n-type layer 3 and the second transparent electrode 4. It is possible to make a multi-junction solar cell by stacking the solar cell 200 in the second embodiment onto a solar cell (e.g., an Si solar cell) having a photovoltaic conversion layer with a narrower band gap than the photovoltaic conversion layer 2.

The n-type layer 3 is an n-type semiconductor layer. The n-type layer 3 is disposed between the photovoltaic conversion layer 2 and the n-electrode 4. The n-type layer 3 is in direct contact with a surface of the p-type light-absorbing layer 2, which surface is opposite to a surface in contact with the first transparent electrode 1. The n-type layer 3 is preferably a layer including an oxide layer and/or a sulfide layer. More specifically, the oxide layer used in the n-type layer 3 is preferably a layer selected from the group consisting of $Zn_{(1-x)}A_xO_y$ (A=Si, Ge, or Sn, $0 \leq x \leq 0.6$, $0.9 \leq y \leq 1.1$), $Cu_{(2-x)}M_xO$ (M=Mn, Mg, Ca, Zn, Sr, or Ba, $0 \leq x \leq 0.3$), $A_{(2-x-y)}Al_yGa_xO_3$ (A=Si, Ge, or Sn, $1.3 \leq x \leq 2$, $0 \leq y \leq 0.7$, x+y$\leq 2$), and $Al_{(2-x)}Ga_xO_3$ ($1.3 \leq x \leq 2$). The sulfide layer used in the n-type layer 3 is preferably at least one sulfide layer selected from the group consisting of $Zn_xIn_{(2-2x)}S_{(3-2x)}$ (1≤x≤1.5), ZnS, and $In_xGa_{(1-x)}S$ (0≤x≤1). The n-type layer 3 may have a multilayer structure obtained by layering the above oxide layer and/or sulfide layer.

The n-type layer 3 typically has a film thickness of from 5 nm to 100 nm. If the thickness of the n-type layer 3 is 5 nm or less, a leak current occurs when the coverage of the n-type layer 3 is poor. This may cause a decrease in the characteristics. When the coverage is good, the film thickness is not limited to the above. If the thickness of the n-type layer 3 exceeds 100 nm, a decrease in the characteristics may occur because the resistance of the n-type layer 4 is too high or a decrease in the short circuit current may occur because the light transmittance is lowered. Thus, the thickness of the n-type layer 3 is preferably from 10 nm to 50 nm. In addition, to realize a film with favorable coverage, the surface roughness of the n-type layer 3 is preferably 5 nm or less. In the case of the n-type layer 3 with high quality, a solar cell can be configured to be operated even at a film thickness of about 200 nm.

A conduction band offset ($\Delta E=Ecp-Ecn$), which is the difference between the potential (Ecp (eV)) at the conduction band minimum (CBM) of the photovoltaic conversion layer 2 and the potential (Ecn (eV)) at the conduction band minimum of the n-type layer 3, is preferably from –0.2 eV to 0.6 eV (–0.2 eV≤$\Delta E$≤+0.6 eV). If the conduction band offset is larger than 0, the conduction band at the p-n junction interface is discontinuous and a spike occurs. If the conduction band offset is smaller than 0, the conduction band at the p-n junction interface is discontinuous and a cliff occurs. The spike and the cliff are each a barrier for photo-manufactured electrons. Accordingly, the smaller, the more preferable. Thus, the conduction band offset is preferably from 0.0 eV to 0.4 eV (0.0 eV≤$\Delta E$≤+0.4 eV). In this regard, the above does not apply to the case of utilizing levels within the gap for conduction. The potential at the CBM may be estimated using the procedure below. Photoelectron spectroscopy, which is a method for evaluating an electron occupied level, is used to actually measure the valence band maximum (VBM). Next, a band gap in a material being measured is estimated. The CBM is then calculated. However, regarding actual p-n junction interfaces, ideal interfaces cannot be kept due to reciprocal diffusion and/or occurrence of cation void. This highly likely causes a change in the band gap. Because of the above, it is preferable to use inverse photoemission spectroscopy, which utilizes a reversal process of photoelectron emission, to directly evaluate the CBM. Specifically, the electronic state at the p-n junction interface can be evaluated by repeated photoelectron spectroscopy/inverse photoelectron spectroscopy and low-energy ion etching of the solar cell surface.

Before the n-type layer 3 is formed, the retention is preferably carried out under an air atmosphere at from 0° C. to 50° C. within 1 h. If the retention time under the air atmosphere is prolonged, the inside of the photovoltaic conversion layer 2 is oxidized. This is not preferable. It is preferable that the n-type layer 3 is formed immediately after the multilayered thin film 100 is manufactured.

It is preferable to use, the second transparent electrode 4, a transparent conductive oxide film (semiconductor conductive film) represented by the first transparent electrode 1 or a multilayered body thereof.

In the second embodiment, the process for manufacturing the multilayered thin film 100 according to the first embodiment should be employed. This makes it possible to manufacture a solar cell with excellent light transmissivity. A film with excellent light transmissivity may be used for the photovoltaic conversion layer 2 and a film with high light transmissivity may also be deposited as other layer(s). This makes it possible to manufacture a solar cell with excellent light transmissivity.

Third Embodiment

Figure 5:
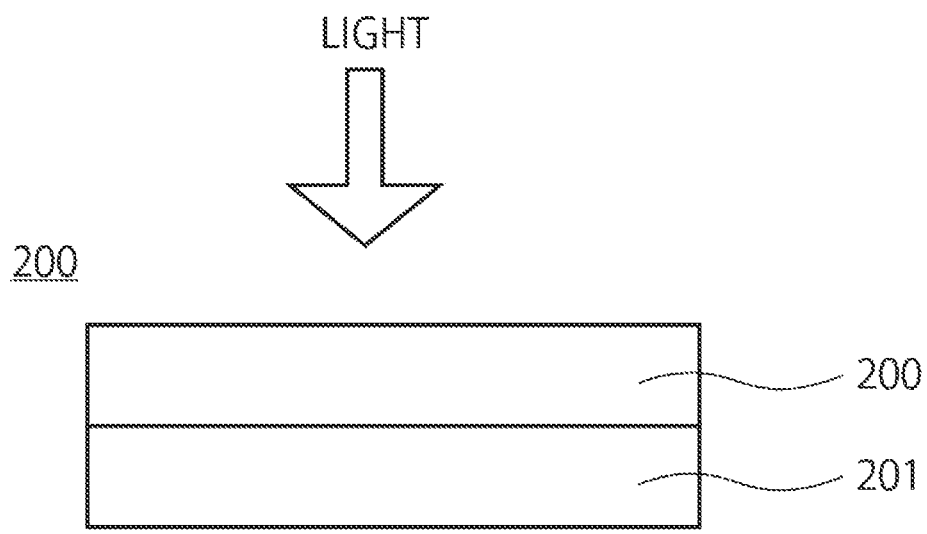
FIG. 5 is a schematic cross-sectional view of a multijunction solar cell in an embodiment.

The third embodiment pertains to a multi-junction solar cell. FIG. 5 is a schematic cross-sectional view illustrating a multi-junction solar cell in the third embodiment. A multi-junction solar cell 200 in FIG. 5 includes: the solar cell (first solar cell) 200 in the second embodiment as disposed on the light incident side; and a second solar cell 201. The first solar cell 200 is manufactured using the multilayered thin film 100 manufactured by the process of the first embodiment. The band gap in the light-absorbing layer of the second solar cell 201 is smaller than the band gap in the photovoltaic conversion layer 2 of the solar cell 200 in the second embodiment. Note that examples of the multi-junction solar cell in this embodiment include a solar cell in which three or more solar cells are joined.

The band gap in the photovoltaic conversion layer of the multilayered thin film 100 in the first embodiment is from about 2.0 eV to 2.2 eV. Accordingly, the band gap in the light-absorbing layer of the second solar cell 201 is preferably from 1.0 eV to 1.6 eV. The light-absorbing layer in the second solar cell is made of preferably one kind selected from the group consisting of perovskite compounds, crystalline silicon, and at least one compound semiconductor selected from the group consisting of CIGS-based and CdTe-based ones with a high In content ratio.

Fourth Embodiment

Figure 6:
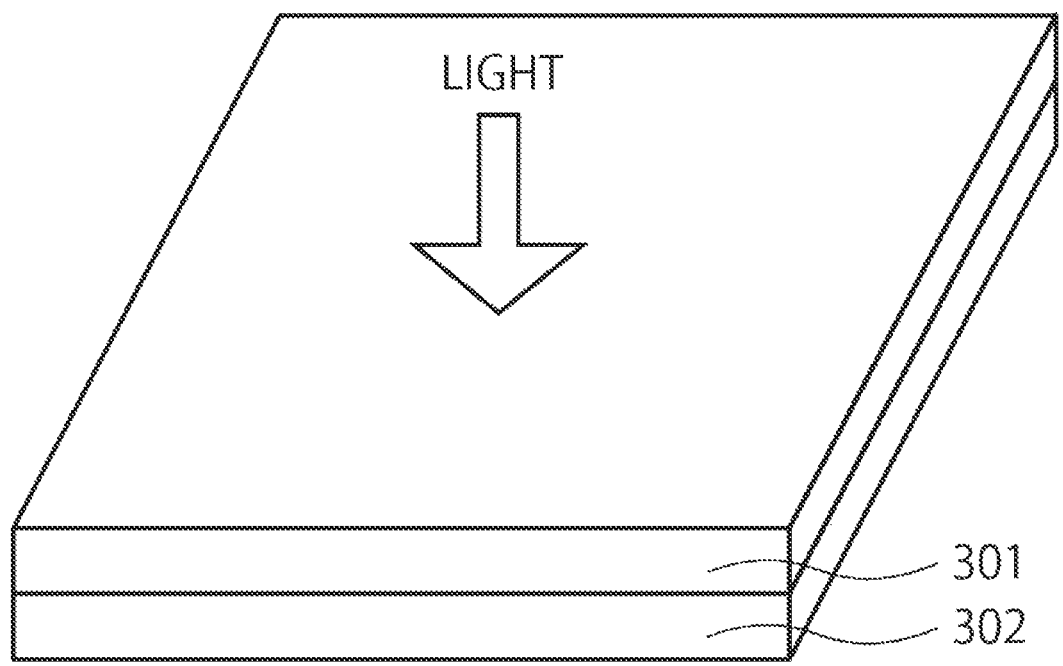
FIG. 6 is a schematic view of a solar cell module in an embodiment.

The fourth embodiment pertains to a solar cell module. FIG. 6 is a perspective view illustrating a solar cell module 300 in the fourth embodiment. The solar cell module 300 in FIG. 6 is a solar cell module in which a first solar cell module 301 and a second solar cell module 302 are stacked. The first solar cell module 301 is placed on the light incident side and uses the solar cell 200 manufactured using the multilayered thin film 100 manufactured by the process of the first embodiment. It is preferable to use the second solar cell 201 for the second solar cell module 302.

Figure 7:
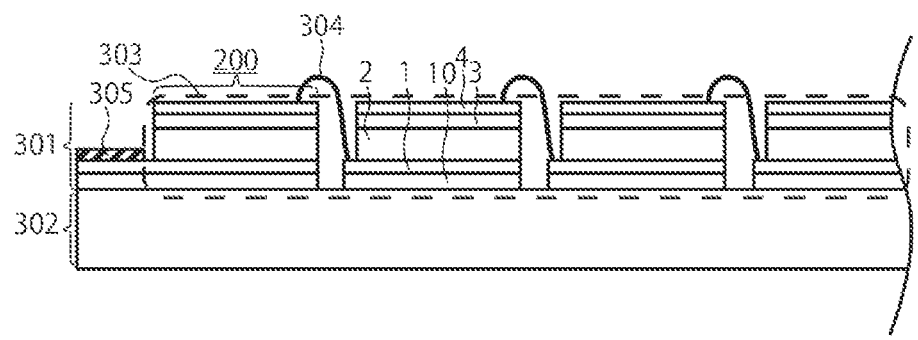
FIG. 7 is a schematic cross-sectional view of the solar cell module in the embodiment.

FIG. 7 is a cross-sectional view illustrating the solar cell module 300. In FIG. 7, the structure of the first solar cell module 301 is depicted in detail, but the structure of the second solar cell module 302 is not illustrated. In the second solar cell module 302, the structure of the solar cell module is chosen, if appropriate, depending on, for instance, the light-absorbing layer in the solar cell used. The solar cell module in FIG. 7 includes a plurality of submodules 303 that are boxed by a dashed line and are electrically connected in series using wiring 304 such that a plurality of solar cells 200 (solar cells) are horizontally arranged. The plurality of submodules 303 are electrically connected in parallel or in series. Adjacent submodules 303 are electrically connected using a bus bar 305.

Adjacent solar cells 200 are configured such that the second transparent electrode 4 on the upper side and the corresponding first transparent electrode 1 on the lower side are connected using wiring 304. Both ends of the solar cell 200 in the submodule 303 are connected to the bus bar 305. The bus bar 305 is configured to electrically connect the plurality of submodules 303 in parallel or in series so as to adjust the voltage output to or from the second solar cell module 302. Note that how to connect the solar cells 200 as illustrated in the fourth embodiment is an example. Thus, the solar cell modules may be configured using other connection styles.

Fifth Embodiment

Figure 8:
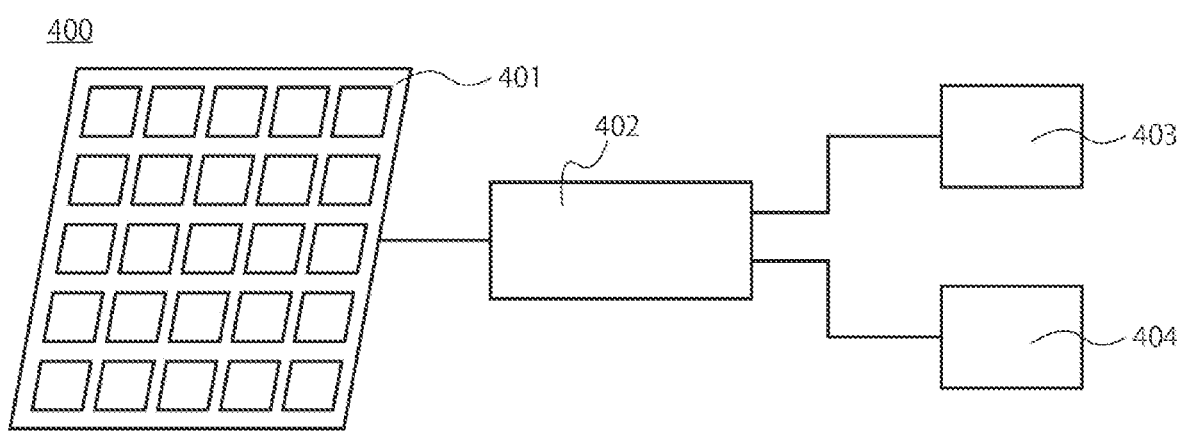
FIG. 8 is a schematic diagram of a photovoltaic power generation system in an embodiment.

The fifth embodiment pertains to a photovoltaic power generation system. The solar cell module in the fourth embodiment may be used as a power generator for generating power in the photovoltaic power generation system in the fifth embodiment. The photovoltaic power generation system in this embodiment is to generate power by using the solar cell module, and specifically includes: the solar cell module configured to generate power; a unit configured to convert generated electricity; and a power storage unit configured to store the generated electricity or a load configured to consume the generated electricity. FIG. 8 is a diagram illustrating the structure of a photovoltaic power generation system 400 in this embodiment. The photovoltaic power generation system in FIG. 8 includes a solar cell module 401 (300), a converter 402, a storage battery 403, and a load 404. Any one of the storage battery 403 or the load 404 may be omitted. The load 404 may be configured to be able to utilize electric energy stored in the storage battery 403. The converter 402 is a device having a circuit or element configured to perform power conversion such as voltage transformation or DC-AC conversion, including a DC-DC converter, a DC-AC converter, or an AC-AC converter. As the configuration of the converter 402, a suitable configuration can be adopted depending on the configuration of the voltage generated, the storage battery 403, and the load 404.

The solar cell, which is included in each light-receiving submodule 301 included in the solar cell module 300, can generate power. This electric energy is converted by the converter 402 and then stored in the storage battery 403 or consumed in the load 404. It is preferable that the solar cell module 401 is equipped with a solar light-tracking device configured to continuously direct the solar cell module 401 toward the sun, is installed with a light condenser configured to condense sunlight, and/or is additionally provided with, for instance, a device configured to improve power generation efficiency.

It is preferable that the photovoltaic power generation system 400 is used in real estates such as houses, commercial facilities, or factories or is used in movable properties such as vehicles, airplanes, or electronics. Use of a photovoltaic conversion element with excellent conversion efficiency for the solar cell module in the above embodiment should increase electric power generation.

Figure 9:
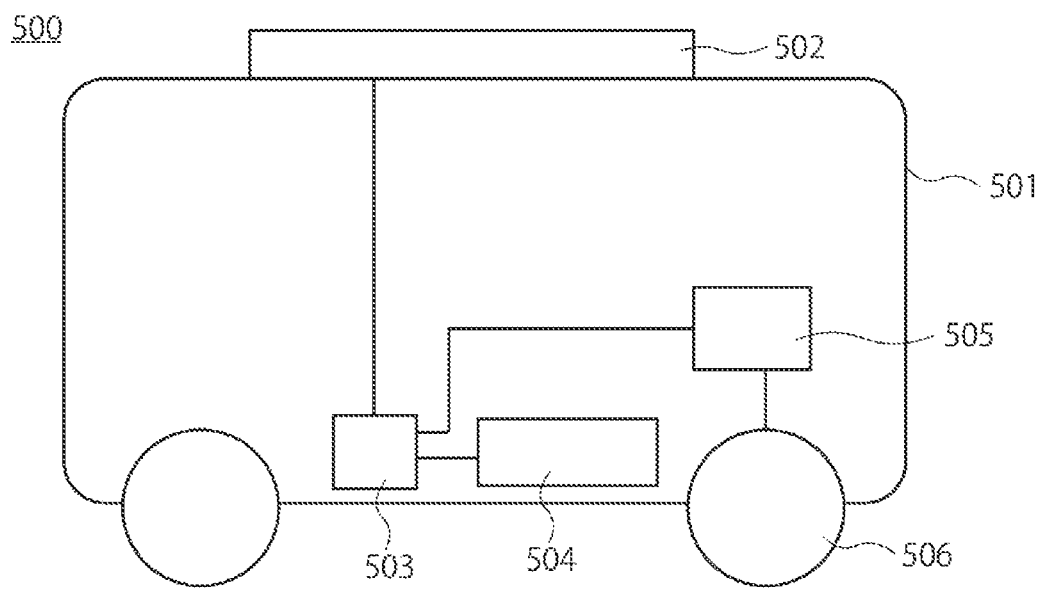
FIG. 9 is a schematic diagram of a vehicle in an embodiment.

A vehicle is shown as an example using the photovoltaic power generation system 400. FIG. 9 is a schematic diagram illustrating a vehicle 500. The vehicle 500 in FIG. 9 includes a vehicle body 501, a solar cell module 502, a power converter 503, a storage battery 504, a motor 505, and tires (wheels) 506. Electric power generated in the solar cell module 502 provided at an upper part of the vehicle body 501 is converted by the power converter 503, and the resulting electric power is then charged in the storage battery 504 or consumed in a load such as the motor 505. Electric power supplied from the solar cell module 502 or the storage battery 504 may be used to drive the vehicle 500 while the tires (wheels) 506 are rotated by the motor 505. The solar cell module 502 is not necessarily a multi-junction type, and may be configured by only the first solar cell module including, for instance, the solar cells 200 in the second embodiment. If a transparent solar cell module 502 is employed, it is preferable to use the solar cell module 502 as a power-generating window provided on a lateral side of the vehicle body 501 as well as on a top part of the vehicle body 501.

Hereinafter, the present disclosure will be described more specifically based on Examples. However, the present disclosure is not limited to the Examples below.

EXAMPLES

Example 1

An ITO transparent conductive film, as a first transparent electrode on the back-surface side, is first deposited on a white plate glass substrate in a chamber, and a Sb-doped $SnO_2$ transparent conductive film is then deposited thereon. The pressure of the chamber, in which a transparent member having the first transparent electrode has been placed, is reduced to $1 \times 10^{-3}$ [Pa] or less. Next, a cuprous oxide compound is deposited thereon as a photovoltaic conversion layer at 2 µm by sputtering in an oxygen and argon gas atmosphere. The resulting member is retained in an air atmosphere at 25° C. for 30 min, and is then retained for 1 h in a low-oxygen atmosphere created by decreasing the levels of oxygen and water vapor in the air (an atmosphere at a temperature of 25° C., an oxygen level of $1.5 \times 10^{-7}$ [g/L], and a water vapor level of $1.2 \times 10^{-6}$ kg/Li). Subsequently, an n-type $Zn_{0.8}Ge_{0.2}O$ is deposited on the p-type cuprous oxide layer by sputtering at room temperature. After that, an AZO transparent conductive film is deposited as a second transparent electrode on the surface side. Finally, $MgF_2$ is deposited thereon as an antireflection film.

Examples 2 to 41, Reference Example 1, and Comparative Examples 1 to 5

Tables in FIGS. 10 and 11 collectively provide Examples, Reference Example, and Comparative Examples. Like Example 1, solar cells in Examples 2 to 41, Reference Example 1, and Comparative Examples 1 to 5 are manufactured under conditions designated in the Tables in FIGS. 10 and 11. Note that in Example 41 and Comparative Example 5, $In_{0.7}Ga_{0.3}S$, instead of the n-type $Zn_{0.8}Ge_{0.2}O$, is deposited on the p-type cuprous oxide layer.

Before the n-type layer film deposition, a region with a depth of 1 nm from a surface of the photovoltaic conversion layer is examined by XPS to check the presence or absence of CuO. The case where the region with a depth of 1 nm from a surface of the photovoltaic conversion layer is found to contain CuO in an amount of from 20 mol % to 100 mol % is graded as A. The case where the region is found to contain CuO in an amount of from 1 mol % to less than 20 mol % is graded as B. The case where the region is found to contain CuO in an amount of less than 1 mol % is graded as C. In addition, Voc is calculated from the conversion efficiency of each solar cell obtained. The case where Voc is 0.95 V or higher is graded as A. The case where Voc is from 0.85 V to less than 0.95 V is graded as B. The case where Voc is less than 0.85 V is graded as C. Further, the transmissivity of light with a wavelength of 700 nm through each solar cell obtained is evaluated. The case where the transmissivity of light with a wavelength of from 700 nm to 1000 nm through the solar cell obtained is 50% or higher is graded as A. The case where the light transmissivity is from 10% to less than 50% is graded as B. The case where the light transmissivity is less than 10% is graded as C. The results are shown in the Table in FIG. 12.

By retaining a sample in an atmosphere with low levels of oxygen and water vapor for a long period, CuO can be generated in a very thin region with a thickness of up to 1 nm. CuO can be likewise generated if the sample is retained in an atmosphere with high levels of oxygen and water vapor for a long period. However, CuO is generated in a deeper region, which causes a decrease in the voltage. Hence, it seems to be better to convert $Cu_2O$ to CuO over considerable time in the atmosphere with low levels of oxygen and water vapor.

The formation of CuO on a surface of the photovoltaic conversion layer when the retention time in the low-oxygen atmosphere is about 0.5 h is not detected. However, when the retention time is 1 h or 10 h, a small amount of CuO formed can be detected. CuO can be abundantly formed selectively in a very thin surface region of the photovoltaic conversion layer when a sample is retained in a low-oxygen atmosphere for 72 h or longer. At this time, the sample is exposed to the air at room temperature for 0.5 h before retained in the low-oxygen atmosphere. A longer retention time in the low-oxygen atmosphere can cause the formation of CuO sufficiently. However, when the sample is retained in the low-oxygen atmosphere for 2000 h like in Reference Example, a further increase in Voc is not observed. Thus, the retention for a long period of 2000 h is not economical. Nevertheless, the retention is suitable treatment from the viewpoint of increasing Voc.

As demonstrated in Examples 9 to 22, even when the oxygen level and the water vapor level are changed, CuO can be formed in a very thin region and Voc is increased. As demonstrated in Examples 23 to 24, even when the product of the oxygen level (water vapor level) and the time is very large, CuO can be formed in a very thin surface region like in other Examples. As demonstrated in Comparative Example 2, when the oxygen level is too low, CuO cannot be formed. As demonstrated in Comparative Examples 3 to 4, when the oxygen level is too high, Voc decreases due to excessive oxidation while CuO is formed.

As demonstrated in Examples 25 to 27, when the temperature is changed from 0° C. to 100° C., CuO can be formed. The CuO formation rate is slow at low temperatures and the CuO formation rate is fast at high temperatures. Accordingly, it is preferable that the oxygen level, the water vapor level, and the time are adjusted within the above ranges depending on the temperature.

In addition, as demonstrated in Examples 28 to 31, even when the air exposure conditions are changed, oxidation does not proceed in a deeper region of the photovoltaic conversion layer unless the treatment is carried out for a long period at a higher temperature. In Example 29, the temperature is high. In addition, in Example 31, the time is long. Accordingly, oxidation proceeds in a deeper region of the photovoltaic conversion layer than in other Examples. This does not exert a harmful effect such as a decrease in Voc.

In Examples 32 and 33, the retention time is 72 h, a higher oxygen level is adopted, and the water vapor level is changed. In any of Examples, CuO is relatively abundantly present in a very thin surface region of the photovoltaic conversion layer; and CuO is not generated in a deeper region; and Voc thus increases. In Example 34, where a higher oxygen level, which is lower than in Example 32, is adopted, the retention time is 50 h. Although the amount of CuO generated is smaller than that in Example 32 or 33, CuO is generated relatively abundantly. Thus, Voc increases.

Further, even when the air exposure conditions are changed like in Examples 35 to 39, oxidation does not proceed in a deep region of the photovoltaic conversion layer unless the treatment is carried out for a long period at a higher temperature. In Example 36, the temperature is high. In addition, in Example 39, the time is long. Accordingly, oxidation proceeds in a deeper region of the photovoltaic conversion layer than in other Examples. This does not exert a harmful effect such as a decrease in Voc.

In Example 40, the total pressure is lower than the atmospheric pressure. Even when the total pressure is low, CuO is likewise formed in a very thin surface region of the photovoltaic conversion layer. In Example 41 and Comparative Example 5, the n-type layer was made of a sulfide. Favorable results are obtained even when the n-type layer is not made of an oxide.

In Example 41, while the retention time is short, the oxygen level is increased. Accordingly, the CuO ratio is high like in the case of retention for a long period. Besides, Voc is excellent.

In the specification, some elements are represented only by chemical symbols for elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A process for manufacturing a multilayered thin film, comprising:
   forming a photovoltaic conversion layer, comprising $Cu_2O$ as a main component, on a first transparent electrode; and
   placing, under a first atmosphere at an oxygen level of from $5.0\times10^{-8}$ [g/L] to $5.0\times10^{-5}$ [g/L] for 1 h to 1600 h, a member having the photovoltaic conversion layer formed on the first transparent electrode.

2. The process for manufacturing a multilayered thin film according to claim 1, wherein a water vapor level in the first atmosphere during the placing under the first atmosphere is from $5.0\times10^{-8}$ [g/L] to $5.0\times10^{-5}$ [g/L].

3. The process for manufacturing a multilayered thin film according to claim 1, further comprising placing, under a second atmosphere of air at from 0° C. to 50° C. for 1 h or less, the member having the photovoltaic conversion layer formed on the first transparent electrode, before the placing under the first atmosphere.

4. The process for manufacturing a multilayered thin film according to claim 1, wherein a temperature of the first atmosphere during the placing under the first atmosphere is from 0° C. to 100° C.

5. The process for manufacturing a multilayered thin film according to claim 1, wherein a retention time in the first atmosphere during the placing under the first atmosphere is from 72 h to 1600 h.

6. The process for manufacturing a multilayered thin film according to claim 1, wherein the oxygen level in a low-oxygen atmosphere during the placing under the first atmosphere is from $5.0\times10^{-8}$ [g/L] to $3.5\times10^{-5}$ [g/L], and
   a water vapor level in the low-oxygen atmosphere during the placing under the first atmosphere is from $5.0\times10^{-8}$ [g/L] to $4.0\times10^{-5}$ [g/L].

7. The process for manufacturing a multilayered thin film according to claim 1, wherein when a retention time in the first atmosphere during the placing under the first atmosphere is defined as t [h], the oxygen level in the first atmosphere is defined as $C_O$ [g/L], and a water vapor level in the first atmosphere is defined as $C_W$ [g/L], $1.0 \times 10^{-7}$ [h·g/L]≤t×$C_O$ [h·g/L]≤$1.6 \times 10^{-3}$ [h·g/L] is satisfied, and $1.0 \times 10^{-7}$ [h·g/L]≤t×$C_W$ [h·g/L]≤$6.5 \times 10^{-2}$ [h·g/L] is satisfied.

8. A method of manufacturing a solar cell, comprising manufacturing a multilayered thin film by the process for manufacturing a multilayered thin film according to claim 1.

9. A method of manufacturing a multi-junction solar cell, comprising manufacturing a multilayered thin film by the process for manufacturing a multilayered thin film according to claim 1.

10. A method for manufacturing a solar cell module, comprising manufacturing a multilayered thin film by the process for manufacturing a multilayered thin film according to claim 1.

* * * * *